(12) United States Patent
Ho et al.

(10) Patent No.: US 11,217,919 B2
(45) Date of Patent: Jan. 4, 2022

(54) ELECTRICAL CONNECTOR WITH RECESSED OPENING FOR ACCOMMODATING INCREASED ELASTIC ARM LENGTH

(71) Applicant: LOTES CO., LTD, Keelung (CN)

(72) Inventors: Tung Ming Ho, Keelung (TW); Yung Sheng Kung, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/931,900

(22) Filed: Jul. 17, 2020

(65) Prior Publication Data

US 2021/0028566 A1   Jan. 28, 2021

(30) Foreign Application Priority Data

Jul. 23, 2019 (CN) .......................... 201910666773.6
Nov. 7, 2019 (CN) .......................... 201911081075.6

(51) Int. Cl.
*H01R 12/71* (2011.01)
*H01R 12/70* (2011.01)
(Continued)

(52) U.S. Cl.
CPC ....... *H01R 12/714* (2013.01); *H01R 12/7047* (2013.01); *H01R 13/24* (2013.01);
(Continued)

(58) Field of Classification Search
CPC .. H01R 12/55; H01R 12/714; H01R 12/7047; H01R 12/00; H01R 12/52; H01R 12/526;
(Continued)

(56) References Cited

U.S. PATENT DOCUMENTS 6,923,657 B2* 8/2005 Brown ............... H01R 13/2442
439/71
7,052,284 B2* 5/2006 Liao ................... H01R 13/2435
439/66

(Continued)

FOREIGN PATENT DOCUMENTS

CN        202231193 U    5/2012
CN        206461119 U    9/2017

*Primary Examiner* — Peter G Leigh
(74) *Attorney, Agent, or Firm* — Locke Lord LLP; Tim Tingkang Xia, Esq.

(57) ABSTRACT

An electrical connector includes a body having an opening running vertically therethrough. The opening has a first side wall. The body further includes a recess concavely formed on the first side wall. At least one conductive terminal includes a base fixed to the body, a conducting portion connected to the base to be electrically connected to a second mating member, and an elastic arm connected to the base in the recess. The elastic arm includes a connecting section located in the recess and an extending section connected to the connecting section. Both the conducting portion and the extending section protrude from the first side wall toward the opening. The extending section has a contact portion electrically connected to a first mating member. In a top view, a first central line of the extending section and a second central line of the conducting portion are parallel to each other.

20 Claims, 16 Drawing Sheets

(51) Int. Cl.
*H01R 13/24* (2006.01)
*H01R 13/502* (2006.01)
*H01R 43/16* (2006.01)
*H01R 43/20* (2006.01)
*H05K 3/34* (2006.01)

(52) U.S. Cl.
CPC ........... *H01R 13/502* (2013.01); *H01R 43/16* (2013.01); *H01R 43/20* (2013.01); *H05K 3/341* (2013.01)

(58) Field of Classification Search
CPC ...... H01R 12/523; H01R 13/24; H01R 13/40; H01R 13/46; H01R 13/502; H01R 13/16; H01R 13/20
USPC .......................................................... 439/66
See application file for complete search history.

(56) References Cited

U.S. PATENT DOCUMENTS

| | | | | |
|---|---|---|---|---|
| 7,341,485 B2* | 3/2008 | Polnyi | ................ | H01R 13/2435 439/591 |
| 7,390,195 B2* | 6/2008 | Liao | .................. | H01R 13/2435 439/66 |
| 7,791,443 B1* | 9/2010 | Ju | ........................... | H01R 12/52 336/107 |
| 8,172,623 B1* | 5/2012 | Zhu | .................... | H01R 13/2428 439/709 |
| 8,277,230 B2* | 10/2012 | Huo | ........................ | H01R 12/73 439/66 |
| 8,323,038 B2* | 12/2012 | Jin | ..................... | H01R 13/2442 439/83 |
| 8,342,874 B2* | 1/2013 | Zhu | ....................... | H01R 12/714 439/357 |
| 9,806,444 B1* | 10/2017 | Ju | ........................... | H01R 12/57 |
| 2004/0157476 A1* | 8/2004 | Maldonado | ........ | H01R 13/5202 439/66 |
| 2006/0035484 A1* | 2/2006 | Hsu | .................... | H01R 13/2435 439/66 |
| 2007/0218764 A1* | 9/2007 | Chang | ................ | H01R 13/2492 439/607.01 |
| 2010/0184334 A1* | 7/2010 | Ma | ..................... | H01R 13/2442 439/626 |
| 2016/0344118 A1 | 11/2016 | Hsieh et al. | | |
| 2017/0365947 A1* | 12/2017 | Costello | ............. | H01R 13/2442 |
| 2018/0198226 A1* | 7/2018 | Ju | ........................... | H01R 12/57 |
| 2018/0212347 A1* | 7/2018 | Chang | ..................... | H01R 4/02 |
| 2018/0331441 A1* | 11/2018 | Huang | ................ | H01R 12/716 |

* cited by examiner

ELECTRICAL CONNECTOR WITH RECESSED OPENING FOR ACCOMMODATING INCREASED ELASTIC ARM LENGTH

CROSS-REFERENCE TO RELATED PATENT APPLICATION

This non-provisional application claims priority to and the benefit of, pursuant to 35 U.S.C. § 119(a), patent application Serial No. CN201910666773.6 filed in China on Jul. 23, 2019, and patent application Serial No. CN201911081075.6 filed in China on Nov. 7, 2019. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and particularly to an electrical connector for improving elasticity of the terminals.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

U.S. Application Publication No. US20160344118 discloses an electrical connector, which includes a body including an opening, and multiple conductive terminals fixed to the body at two sides of the opening. Each conductive terminal includes an elastic arm and a conducting portion protruding from the same side wall of the opening and accommodated in the opening. The elastic arm protrudes upward out of the opening to mate with a chip module, and the conducting portion protrudes downward out of the opening to mate with a circuit board. One of the current technical trends is the lightening and thinning of the electronic components. However, simply reducing an overall height of the conductive terminal to realize lightening and thinning will result in insufficient elasticity of its elastic arm. the elasticity of the elastic arm can be increased by increasing a length of the elastic arm, thus making up for the elastic attenuation caused by the reduced height. However, in the electrical connector disclosed in US20160344118, the conductive terminals are fixed at the two sides of the opening, and increasing the length of the elastic arm from a tail end of the elastic arm may easily cause short-circuiting between the terminals.

Therefore, a heretofore unaddressed need to design an improved electrical connector exists in the art to address the aforementioned deficiencies and inadequacies.

SUMMARY

The present invention is directed to an electrical connector, in which a body is formed with a recess, such that an elastic arm can extend into the body.

To achieve the foregoing objective, the present invention adopts the following technical solutions.

An electrical connector is located between a first mating member and a second mating member and electrically connecting the first mating member with the second mating member. The electrical connector includes: a body, having an opening running vertically therethrough, wherein the opening has a first side wall, and the body further comprises a recess concavely formed on the first side wall toward the body; and a conductive terminal, comprising a base fixed to the body, a conducting portion connected to the base and formed by protruding from the first side wall toward the opening, and an elastic arm connected to the base in the recess, wherein the conducting portion is configured to be electrically connected to the second mating member, the elastic arm comprises a connecting section located in the recess and an extending section connected to the connecting section and formed by protruding from the first side wall toward the opening, the extending section has a contact portion to be electrically connected to the first mating member, and in a top view, a first virtual central line of the extending section and a second virtual central line of the conducting portion are parallel to each other.

In certain embodiments, the recess comprises a second side wall connected to the first side wall, a third side wall connected to the first side wall and a fourth side wall connected to the second side wall and the third side wall, the second side wall and the third side wall are located at two opposite sides of the recess, and the connecting section is located between the second side wall and the third side wall.

In certain embodiments, the connecting section is formed by protruding from the fourth side wall and extending in a direction toward the first side wall.

In certain embodiments, a distance between the extending section and the second side wall is greater than a distance between the extending section and the third side wall. In certain embodiments, the connecting section is formed by protruding from the third side wall and bending and extending toward the first side wall.

In certain embodiments, a virtual median line of a space between the extending section and the conducting portion is located between the extending section and the third side wall.

In certain embodiments, the body has a protruding block formed by protruding from the third side wall toward the second side wall, the protruding block fixes the base, the protruding block has a fifth side wall facing the fourth side wall and provided opposite to the first side wall, and the connecting section is formed by firstly extending from the fifth side wall away from the first side wall and then bending and extending toward the first side wall.

In certain embodiments, a virtual median line of a space between the extending section and the conducting portion is located between the extending section and the protruding block.

In certain embodiments, at least a portion of the connecting section bends and extends in a plane where the base is located.

In certain embodiments, a lower surface of the body has two pins protruding downward and a channel formed between the two pins at one side of the opening, the pins are configured to abut the second mating member, the channel is in communication with the recess, and the conducting portion protrudes from the first side wall corresponding to one of the pins to be soldered to the second mating member.

An electrical connector is located between a first mating member and a second mating member and electrically connecting the first mating member with the second mating member. The electrical connector includes: a body, having an opening running vertically therethrough, wherein the opening has a first side wall, and the body further comprises a recess concavely formed on the first side wall toward the body; and a conductive terminal, comprising a base fixed to the body, a conducting portion connected to the base and an elastic arm connected to the base, wherein at least a portion of the elastic arm is accommodated in the recess, the conducting portion is configured to be electrically connected to the second mating member, and the elastic arm is provided with a contact portion to be electrically connected to the first mating member.

In certain embodiments, the recess comprises a second side wall connected to the first side wall, a third side wall connected to the first side wall and a fourth side wall connected to the second side wall and the third side wall, the second side wall and the third side wall are located at two opposite sides of the recess, and the elastic arm is formed by protruding from the fourth side wall and extending in a direction toward the first side wall.

In certain embodiments, the recess comprises a second side wall connected to the first side wall, a third side wall connected to the first side wall and a fourth side wall connected to the second side wall and the third side wall, the second side wall and the third side wall are located at two opposite sides of the recess, and the elastic arm is formed by protruding from the third side wall and bending and extending toward the first side wall.

In certain embodiments, the elastic arm comprises an extending section parallel to the conducting portion, and a distance between the extending section and the second side wall is greater than a distance between the extending section and the third side wall.

In certain embodiments, the recess comprises a second side wall connected to the first side wall, a third side wall connected to the first side wall and a fourth side wall connected to the second side wall and the third side wall, the second side wall and the third side wall are located at two opposite sides of the recess, the body has a protruding block formed by protruding from the third side wall toward the second side wall, the protruding block fixes the base, the protruding block has a fifth side wall facing the fourth side wall and provided opposite to the first side wall, and the elastic arm is formed by firstly extending from the fifth side wall away from the first side wall and then bending and extending toward the first side wall.

In certain embodiments, the elastic arm comprises an extending section parallel to the conducting portion, and a distance between the extending section and the second side wall is less than a distance between the extending section and the protruding block.

In certain embodiments, at least a portion of the elastic arm is parallel to the conducting portion.

In certain embodiments, the electrical connector includes a plurality of conductive terminals, wherein the conductive terminals are arranged along the first side wall, the body comprises a plurality of recesses concavely formed on the first side wall, the body has a partition provided between each two adjacent ones of the recesses, the elastic arms of the conductive terminals are one-to-one accommodated in the recesses, and the base of each of the conductive terminals is completely covered by the body in an arrangement direction of the conductive terminals.

In certain embodiments, the recess runs through the body vertically, the elastic arm extends from the recess toward the opening, and the conducting portion is connected to the base in the opening.

In certain embodiments, a lower surface of the body has two pins protruding downward and a channel formed between the two pins at one side of the opening, the pins are configured to abut the second mating member, the channel is in communication with the recess, and the conducting portion protrudes from the first side wall corresponding to one of the pins to be soldered to the second mating member.

Compared with the related art, certain embodiments of the present invention have the following beneficial effects: the recess concavely provided on the first side wall of the opening is formed in the body, and a portion of the elastic arm is located in the recess and extends toward the opening, thereby increasing a length of the elastic arm so as to increase elasticity.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
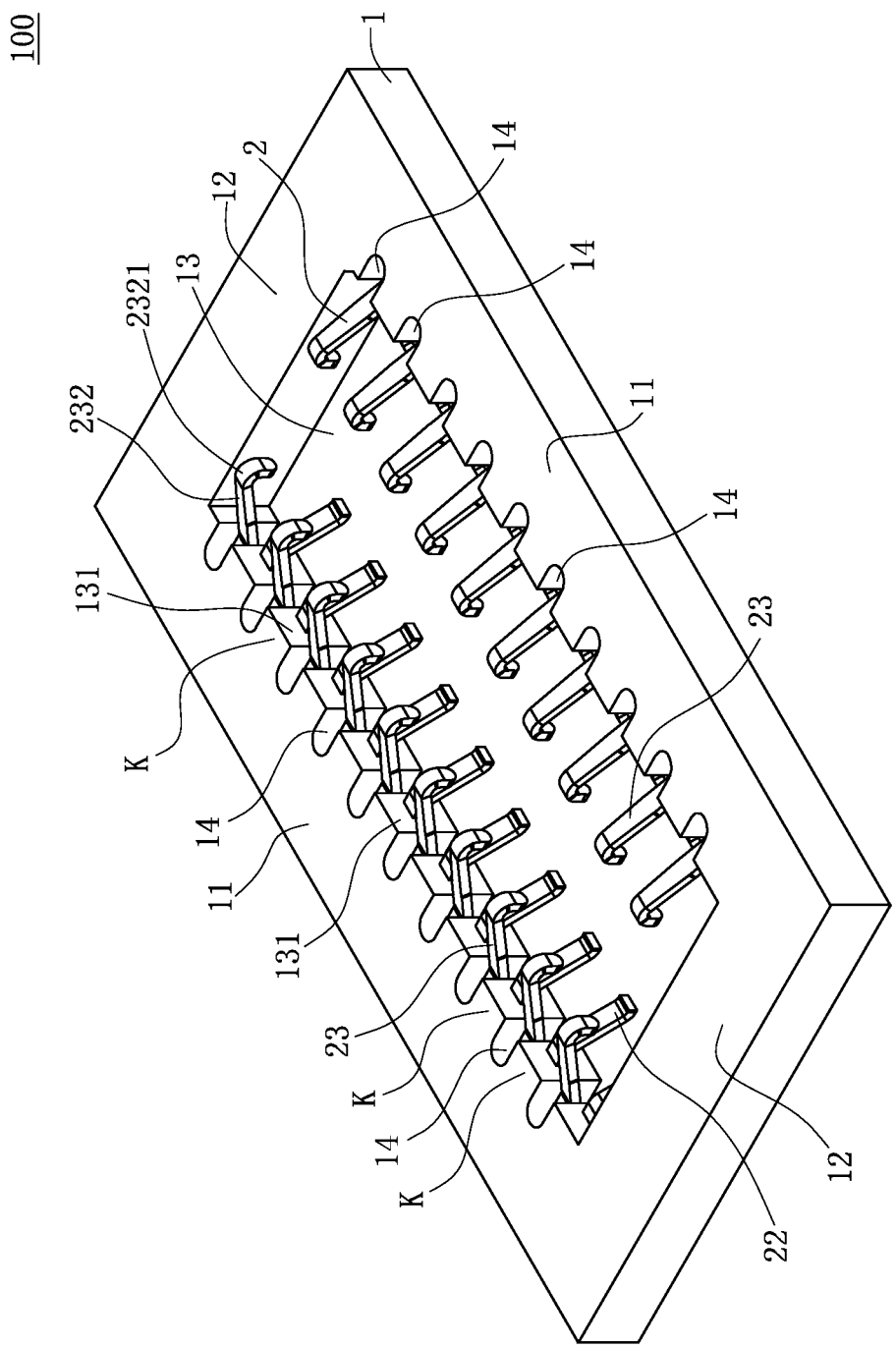
FIG. 1 is a perspective view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-16. In accordance with the purposes of this invention, as embodied and broadly described herein, this invention, in one aspect, relates to an electrical connector.

FIG. 1 to FIG. 4 show an electrical connector 100 according to a first embodiment of the present invention, which includes a body 1 and multiple conductive terminals 2 fixed to the body 1. The electrical connector 100 is used to electrically connect a first mating member 400 and a second mating member 500 respectively located at upper and lower sides thereof. In the present embodiment, the first mating member 400 is a chip module, and the second mating member 500 is a circuit board.

Figure 2:
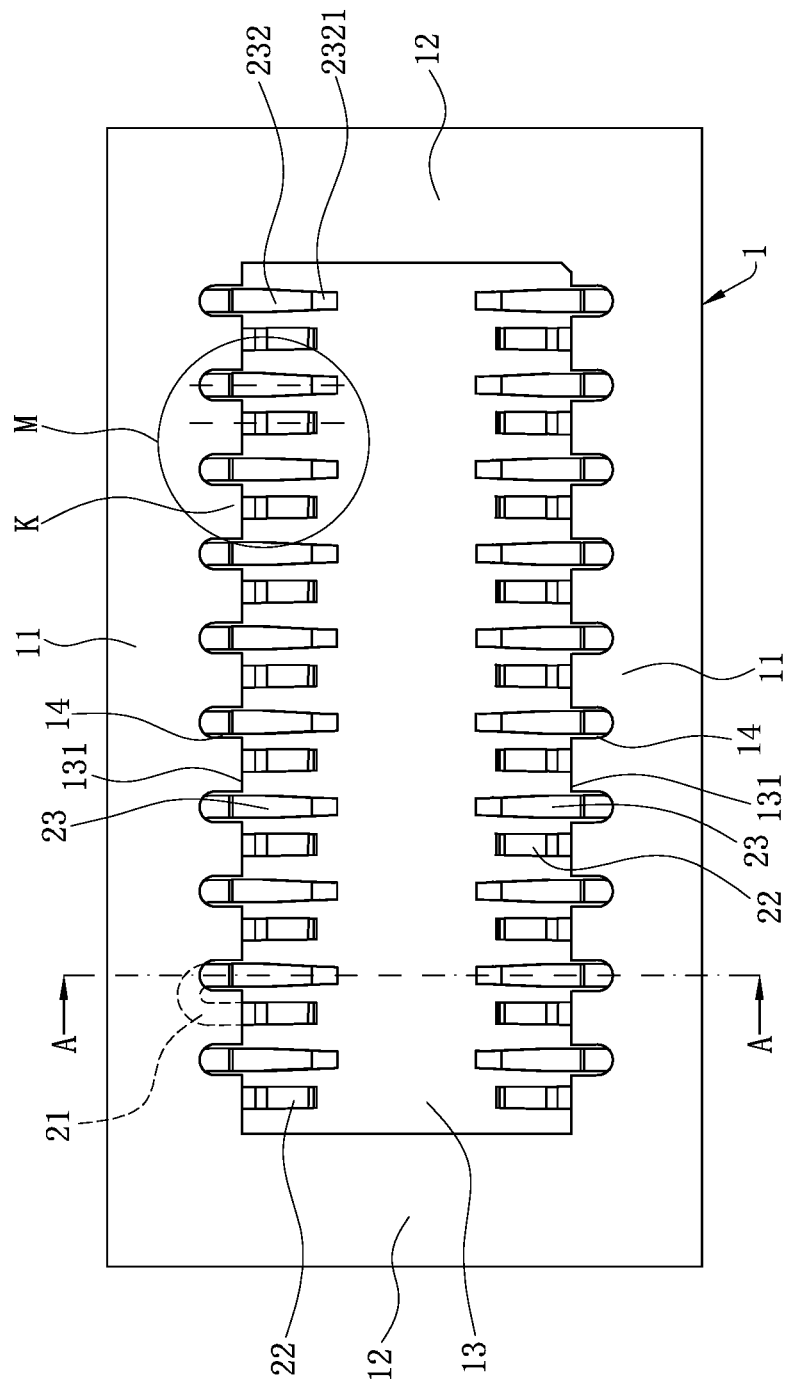
FIG. 2 is a top view of FIG. 1.

As shown in FIG. 1 and FIG. 2, the body 1 is made of an insulating material, and is a rectangular shaped frame. The body 1 includes two long edges 11 opposite to each other and two short edges 12 connecting the two long edges 11.

The body 1 has an opening 13 running vertically therethrough and surrounded by the two long edges 11 and the two short edges 12, and an inner side wall of each of the long edges 11 facing the opening 13 serves as a first side wall 131 of the opening 13. The body 1 further includes multiple recesses 14 concavely formed on the first side walls 131. In other words, the recesses 14 are provided on each of the long edges 11 and in communication with the opening 13. Each of the recesses 14 runs through the body 1 vertically.

Figure 3:
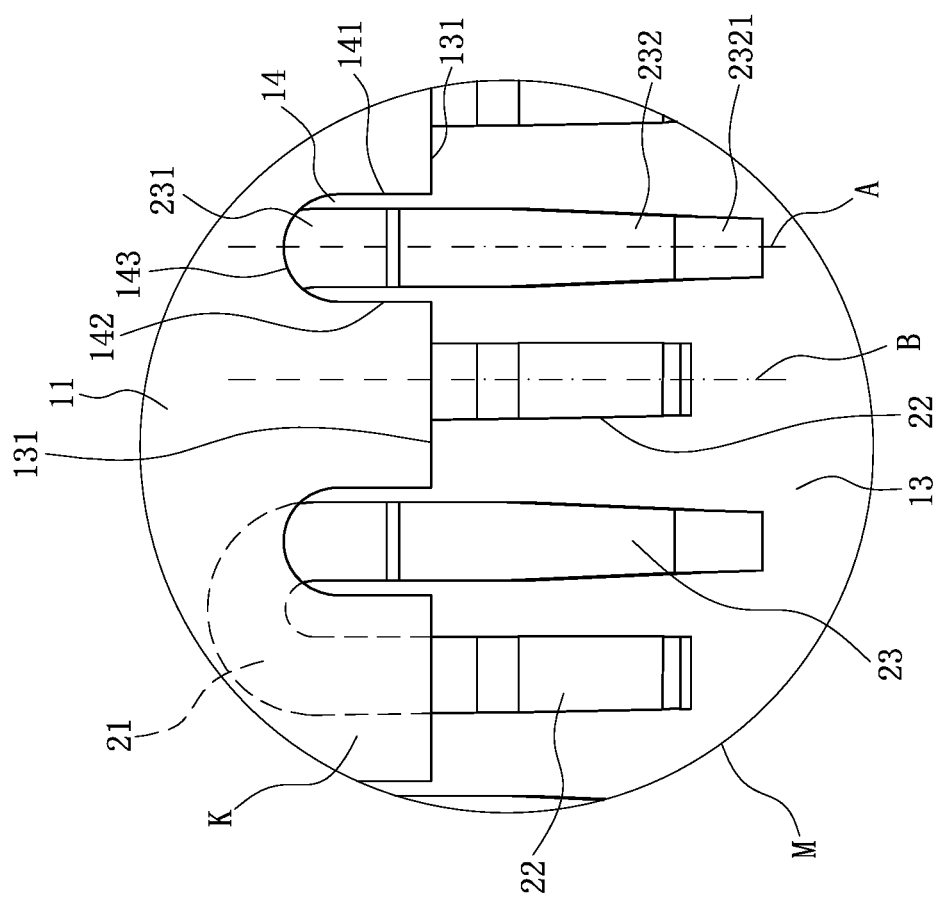
FIG. 3 is a partial enlarged view of FIG. 2.

As shown in FIG. 2 and FIG. 3, the recess 14 includes a second side wall 141 connected to the corresponding first side wall 131, a third side wall 142 connected to the corresponding first side wall 131 and a fourth side wall 143 connected to the second side wall 141 and the third side wall 142. The second side wall 141 and the third side wall 142 are provided opposite to each other.

As shown in FIG. 2 and FIG. 3, the body 1 has a partition K provided between each two adjacent recesses 14. That is, the partition K is formed and surrounded by one of the first side walls 131, one of the second side walls 141 and one of the third side walls 142.

Figure 4:
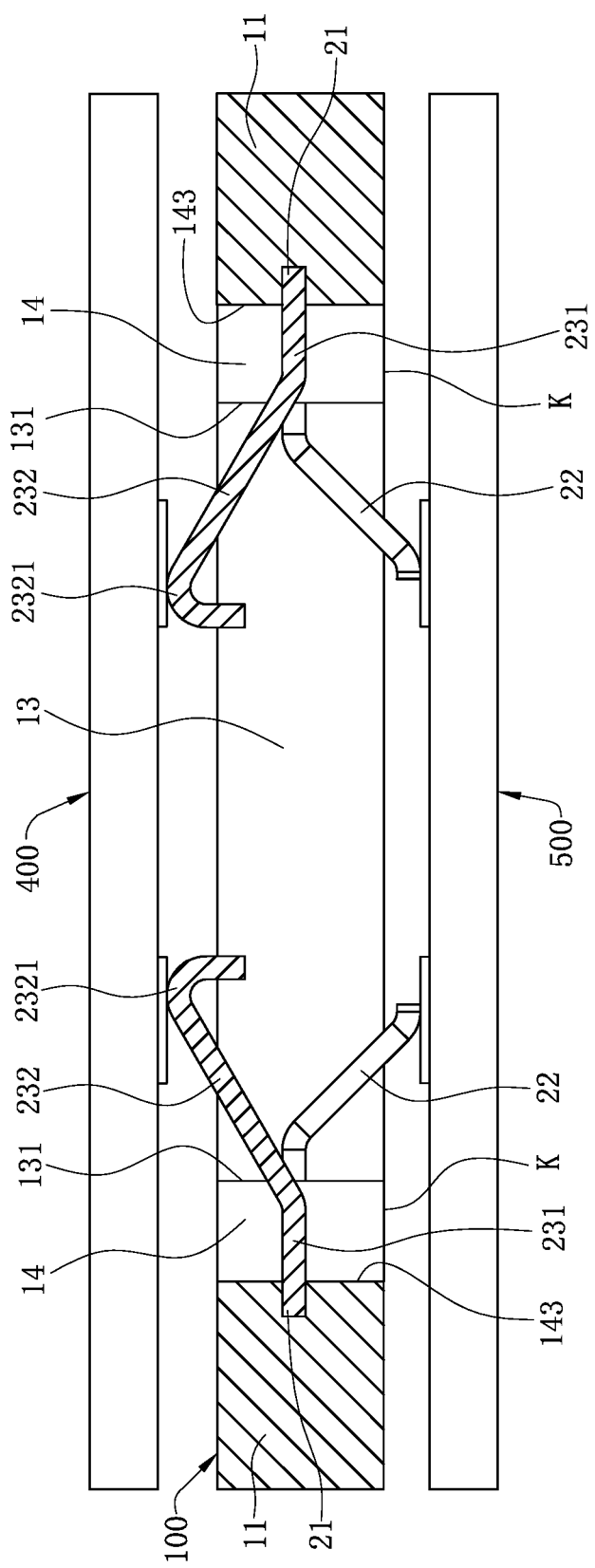
FIG. 4 is a sectional view of FIG. 2 along a line A-A, where the electrical connector mates with a first mating member and a second mating member.

As shown in FIG. 1 and FIG. 4, the conductive terminals 2 are respectively fixed to the two long edges 11. Each of the conductive terminals 2 includes a base 21 covered and fixed by the corresponding long edge 11, a conducting portion 22 connected to one end of the base 21 and formed by protruding from the corresponding first side wall 131 toward the opening 13, and an elastic arm 23 connected to the other end of the base 21 in the recess 14. Thus, the elastic arms 23 of the conductive terminals 2 on each of the long edges 11 are one-to-one accommodated in the recesses 14. The base 21 is in a flat plate shape, and the base 21 is completely covered by the body 1 in an arrangement direction of the conductive terminals 2, thus preventing from short-circuiting between two adjacent conductive terminals 2 in the arrangement direction. The conducting portion 22 extends obliquely downward from the first side wall 131 where the partition K is located, and is configured to be electrically connected to the second mating member 500. In the present embodiment, the conducting portion 22 is soldered to the second mating member 500 through a solder (not shown) to form an electrical connection. In addition, in the present embodiment, the conducting portion 22 is connected to the base 21 in the opening 13. In other embodiments, the conducting portion 22 may be connected to the base 21 below the partition K.

As shown in FIG. 3 and FIG. 4, the elastic arm 23 includes a connecting section 231 located in the recess 14, and an extending section 232 connected to the connecting section 231 and formed by protruding from the first side wall 131 toward the opening 13. The connecting section 231 is located between the second side wall 141 and the third side wall 142 and formed by protruding from the fourth side wall 143 and extending in a direction toward the first side wall 131. At least a portion of the connecting section 231 bends and extends in a plane where the base 21 is located. The extending section 232 extends obliquely upward and has a contact portion 2321. The contact portion 2321 is configured to be electrically connected to the first mating member 400. In a top view, as shown in FIG. 3, in an extending direction of the extending section 232, a first virtual central line A of the extending section 232 and a second virtual central line B of the conducting portion 22 are parallel to each other. Since the elastic arm 23 extends from the recess 14, a length of the elastic arm 23 can extend toward a direction away from the conductive terminal 2 located on the other long edge 11 instead of extending toward a direction close to the conductive terminal 2 located on the other long edge 11, thereby increasing the length of the elastic arm 23 to increase elasticity without increasing the overall space occupied by the conductive terminal 2, and preventing from short-circuiting with the other conductive terminals 2.

Figure 5:
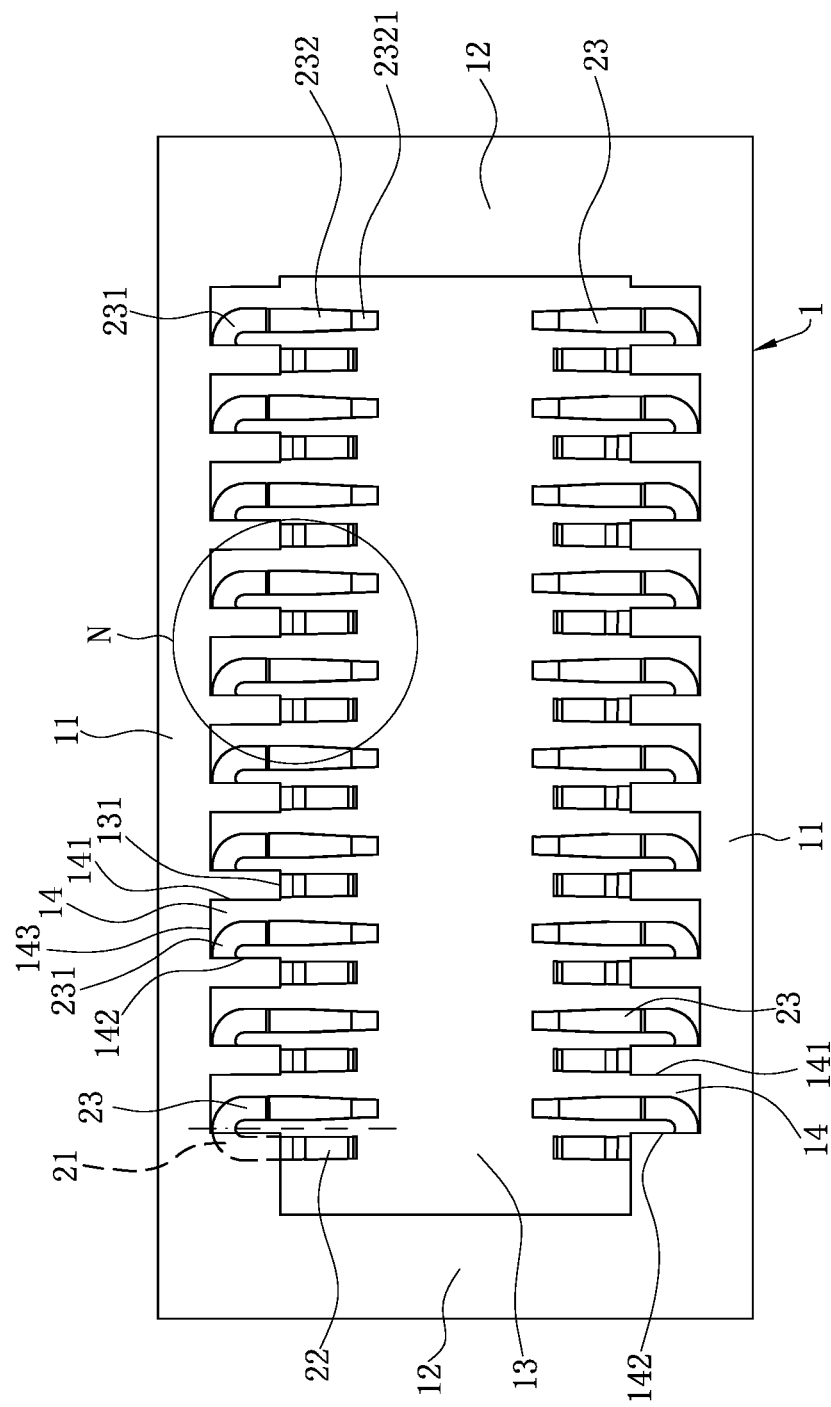
FIG. 5 is a top view of an electrical connector according to a second embodiment of the present invention.
Figure 6:
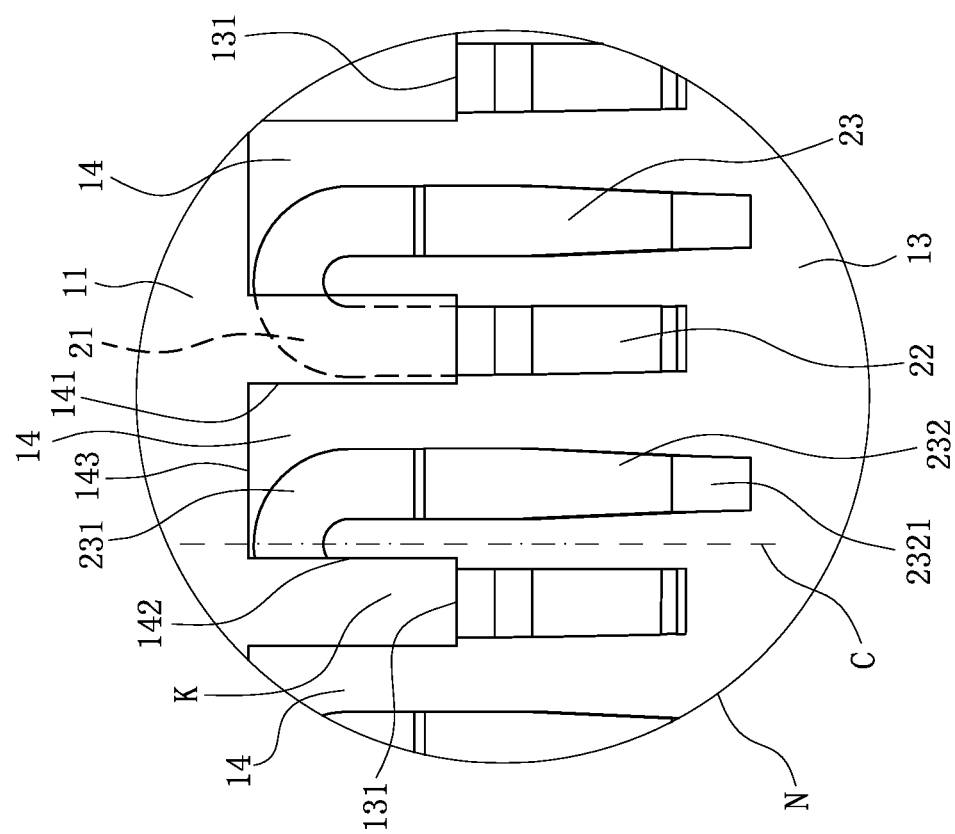
FIG. 6 is a partial enlarged view of FIG. 5.

FIG. 5 and FIG. 6 show an electrical connector 200 according to a second embodiment of the present invention. Compared with the first embodiment, the recesses 14 are enlarged, including being further depressed in a direction away from the opening 13 and increasing a width of each recess 14 in the arrangement direction of the conductive terminals 2 on the same long edge 11. In the present embodiment, the connecting section 231 is formed by protruding from the third side wall 142 and bending and extending toward the first side wall 131. A virtual median line C of a space between the extending section 232 and the conducting portion 22 is located between the extending section 232 and the third side wall 142. That is, a distance between the third side wall 142 and the extending section 232 is greater than half of a distance between the conducting portion 22 and the extending section 232, such that a terminal connecting portion located between the conducting portion 22 and the extending section 232 is more exposed outside the body 1 and serves as a portion of the elastic arm 23. With such arrangement, each conductive terminal 2 is more exposed in the corresponding recess 14. In the present embodiment, the connecting section 231 bends and extends in a plane where the base 21 is located, and passes beyond the virtual median line C to be connected to the base 21, such that the elastic arm 23 is further elongated. In addition, to prevent the extending section 232 from contacting the conducting portion 22 of another adjacent conductive terminal 2 and thus forming short-circuiting, a distance between the extending section 232 and the conducting portion 22 of another adjacent conductive terminal 2 is increased, such that a distance between the extending section 232 and the second side wall 141 is greater than the distance between the extending section 232 and the third side wall 142.

Figure 7:
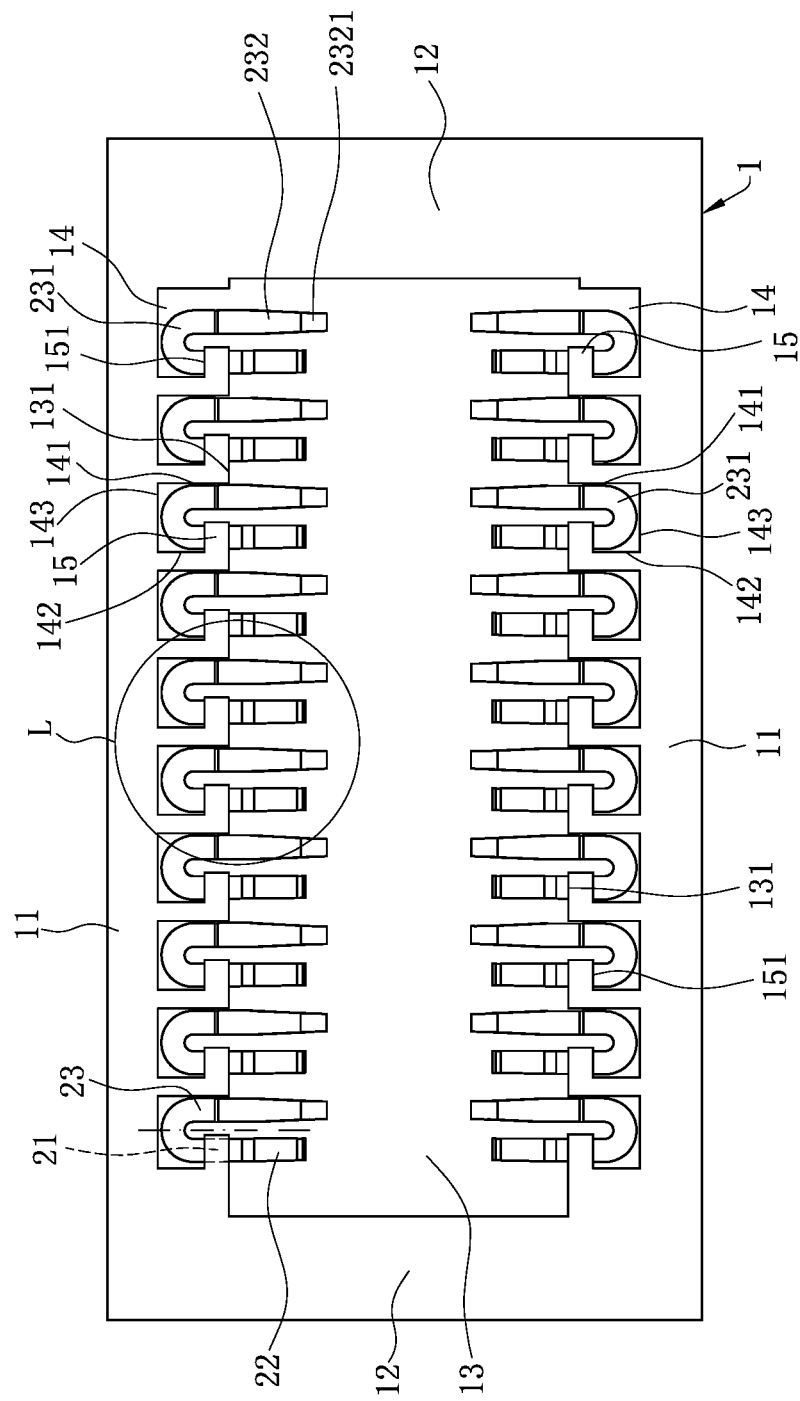
FIG. 7 is a top view of an electrical connector according to a third embodiment of the present invention.
Figure 8:
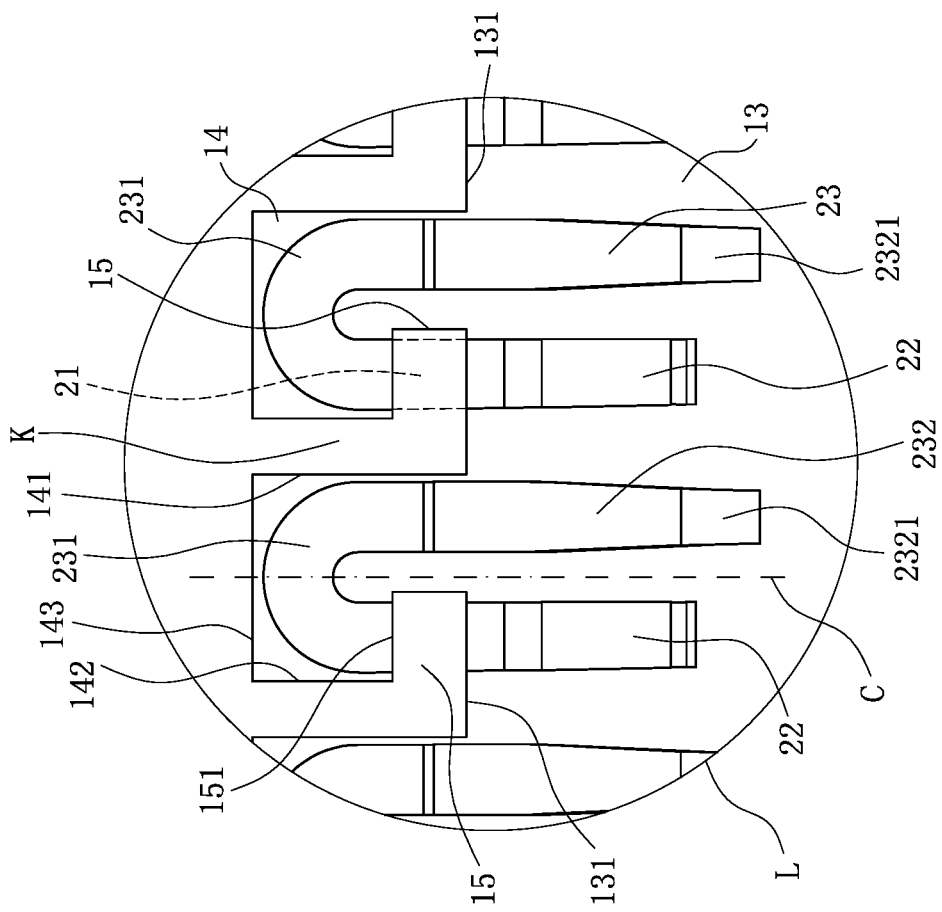
FIG. 8 is a partial enlarged view of FIG. 7.

FIG. 7 and FIG. 8 show an electrical connector 300 according to a third embodiment of the present invention. In the present embodiment, compared with the second embodiment, the body 1 has a protruding block 15 formed by protruding from the third side wall 142 toward the second side wall 141. The protruding block 15 covers and fixes the base 21. The protruding block 15 has a fifth side wall 151 facing the fourth side wall 143 and provided opposite to the first side wall 131. The fifth side wall 151 and the fourth side wall 143 are provided at an interval. The connecting section 231 is formed by firstly extending from the fifth side wall 151 away from the first side wall 131, and then bending and extending toward the first side wall 131. That is, the connecting section 231 is U-shaped, and connects the base 21 and the extending section 232 parallel to each other in the corresponding recess 14. A virtual median line C of a space between the extending section 232 and the conducting portion 22 is located between the extending section 232 and the protruding block 15. That is, the protruding block 15 does not pass beyond the virtual median line C. Compared with the second embodiment, the recesses 14 in the present embodiment are further enlarged in the arrangement direction of the conductive terminals 2 on the same long edge 11, and each conductive terminal 2 is further exposed in the corresponding recess 14. The elastic arm 23 is further elongated, and includes the extending section 232 and the U-shaped connecting section 231, such that the elasticity of the elastic arm 23 is increased. In addition, in the present embodiment, a distance between the extending section 232 and the second side wall 141 is less than a distance between the extending section 232 and the protruding block 15, such that the second side wall 141 is close to the elastic arm 23, thereby stopping the elastic arm 23 from deflecting toward another adjacent conductive terminal 2.

In the first, second and third embodiments as described above, the base 21 is in a flat plate shape, and a portion of the base 21 being fixed in the partition K is a horizontal portion 210.

Figure 9:
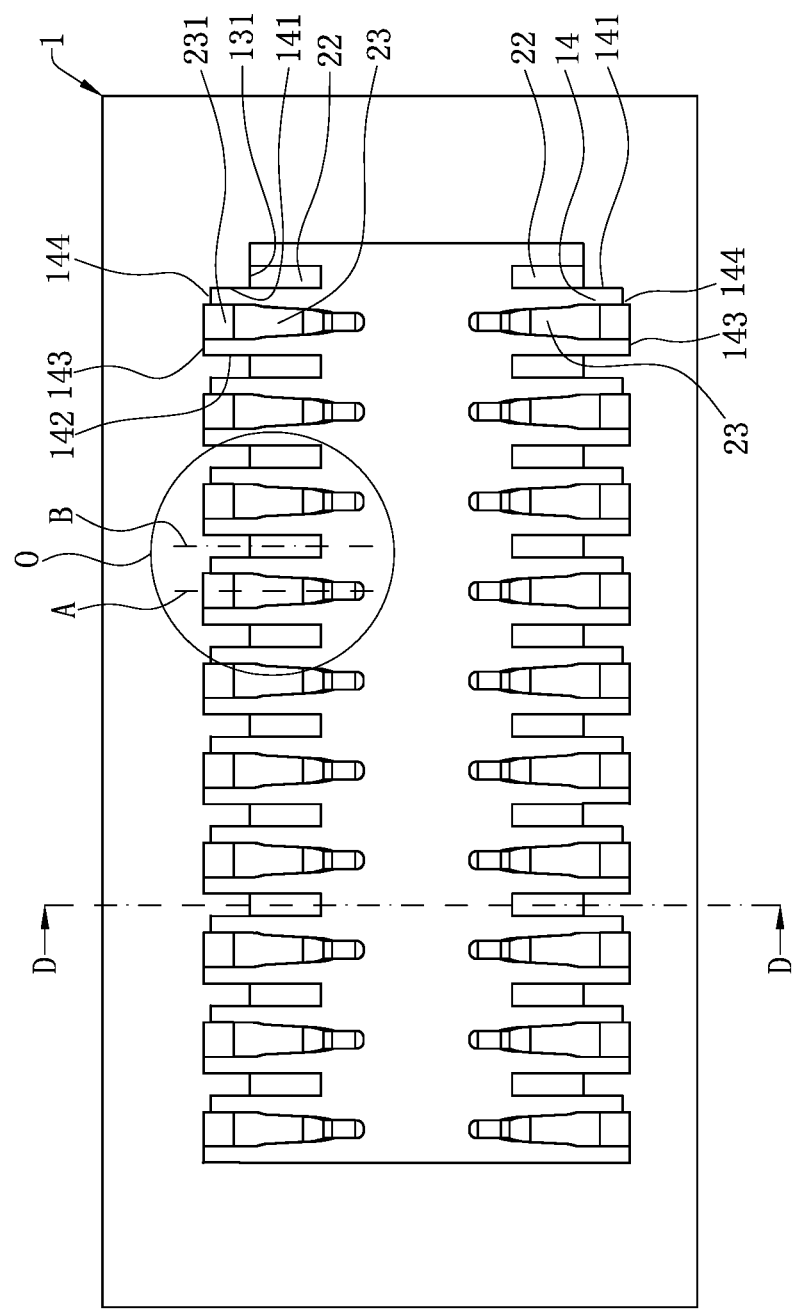
FIG. 9 is a schematic view of an electrical connector according to a fourth embodiment of the present invention.
Figure 10:
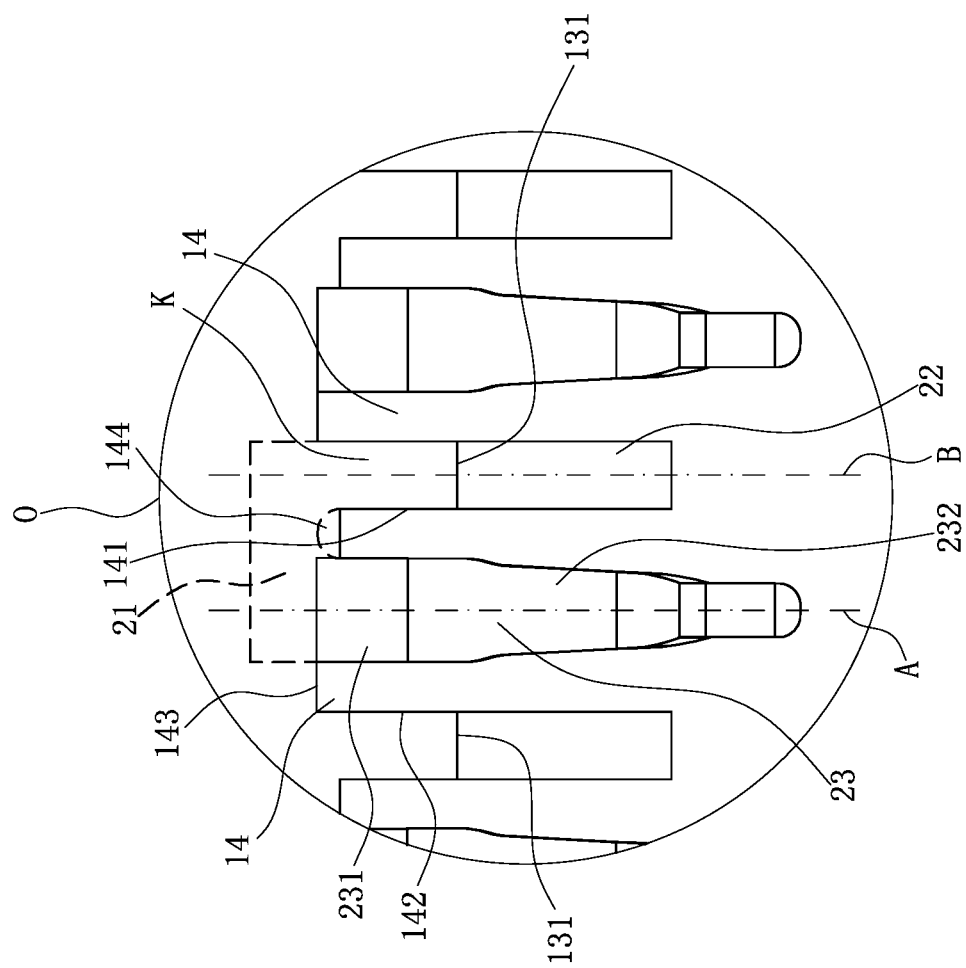
FIG. 10 is a partial enlarged view of FIG. 9.
Figure 12:
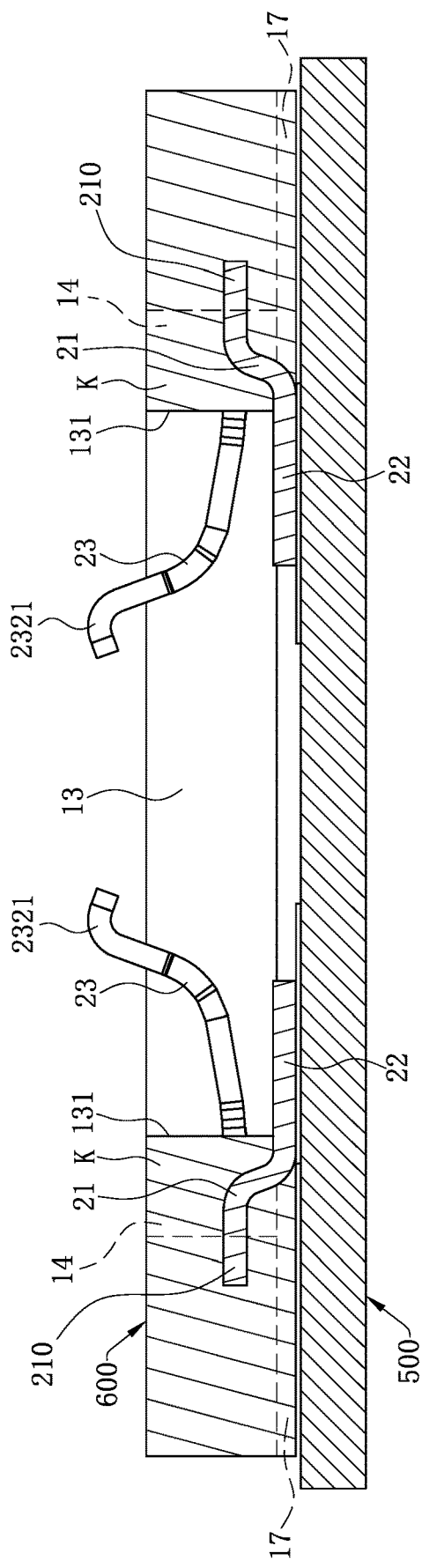
FIG. 12 is a sectional view of the electrical connector of FIG. 9 along a line D-D after mounted to a second mating member.
Figure 13:
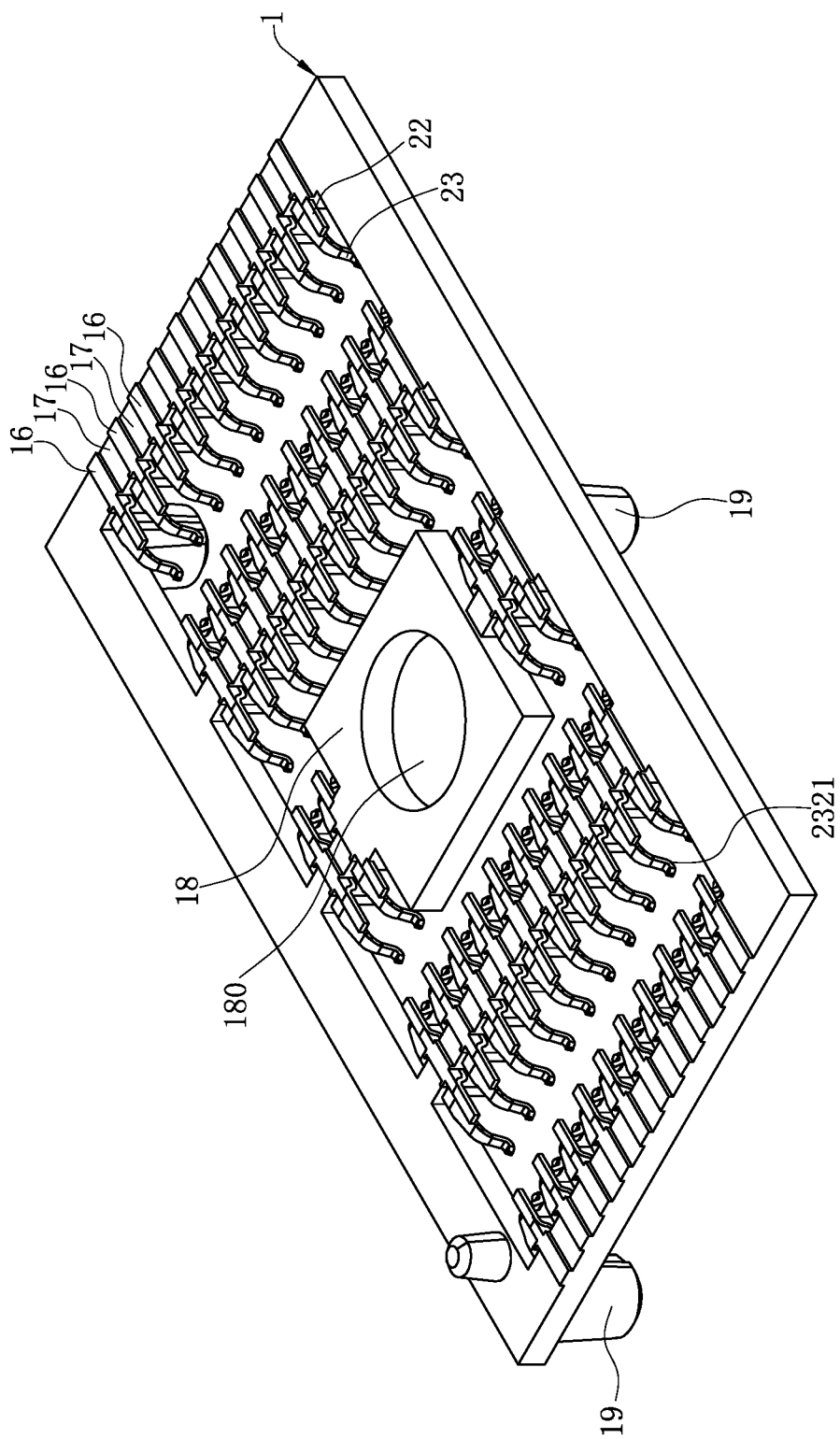
FIG. 13 is a perspective view of an electrical connector according to a fifth embodiment of the present invention.

FIG. 9 to FIG. 12 show an electrical connector 600 according to a fourth embodiment of the present invention, which is different from the foregoing embodiments in that:

As shown in FIG. 9 and FIG. 10, a connecting location between the second side wall 141 and the fourth side wall 143 is provided with a step 144. The step 144 is integrally formed by the body 1 and protrudes into a gap between the elastic arm 23 and the second side wall 141. The step 144 does not protrude out of the first side wall 131 and has a large distance from the first side wall 131. A width of the connecting section 231 is greater than a width of the conducting portion 22 to adjust the elasticity and strength of the elastic arm 23. As shown in FIG. 12, the horizontal portion 210 of the base 21 is fixed in the partition K, and a portion of the base 21 bends in the partition K in a vertical direction, and is connected to the conducting portion 22 at the bottom of the partition K.

Figure 11:
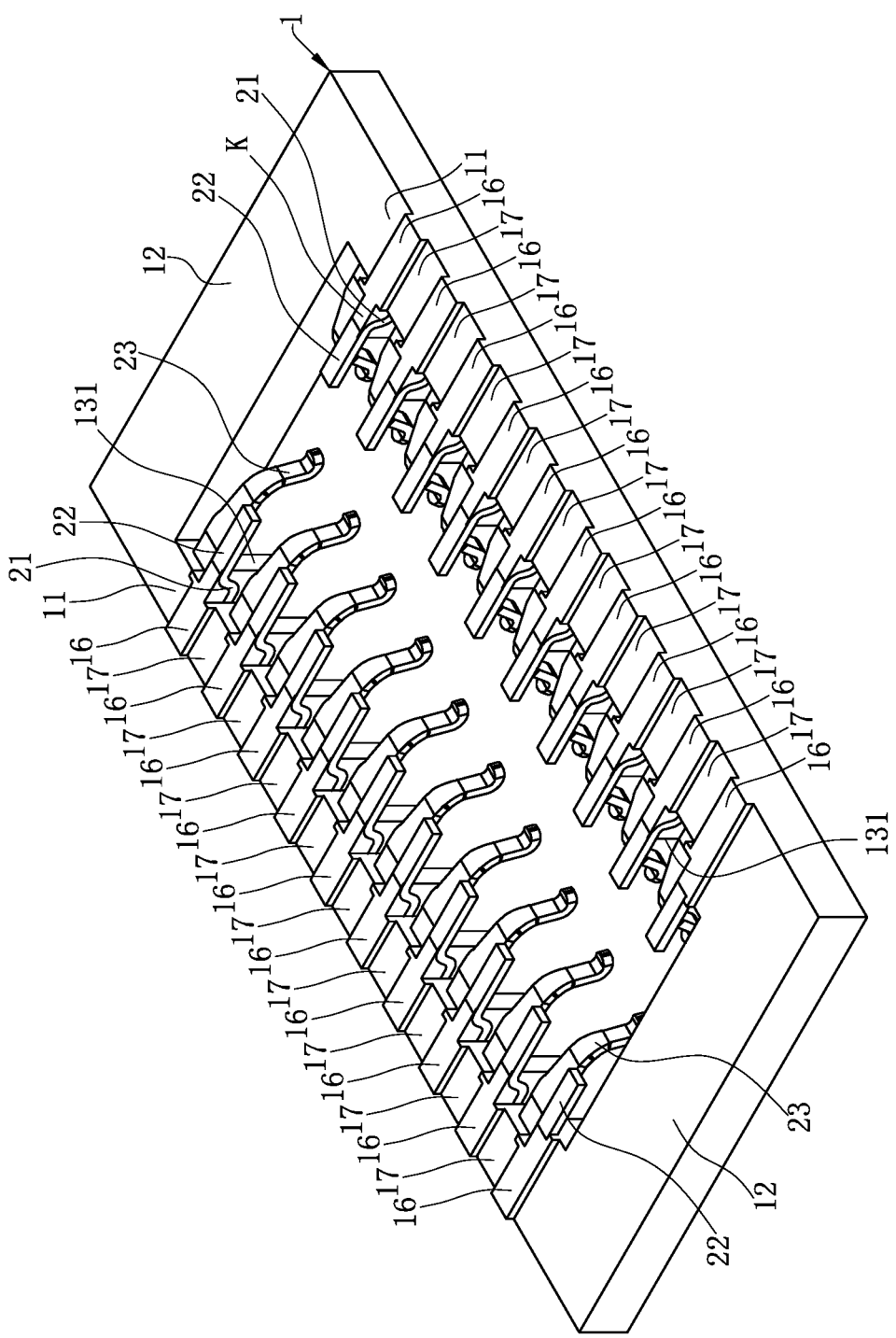
FIG. 11 is a perspective view of the electrical connector according to the fourth embodiment of the present invention with its bottom surface facing upward.

As shown in FIG. 11 and FIG. 12, the conducting portion 22 is soldered to the second mating member 500 by surface soldering. A lower surface of each long edge 11 has multiple pins 16 protruding downward. The pins 16 are configured to downward abut the second mating member 500. A portion of each pin 16 extends horizontally in a direction toward the opening 13 to a position below the partition K. Each of the conducting portions 22 corresponds to one of the pins 16 (that is, the bottom of the partition K) to protrude from the corresponding first side wall 141 and protrude into the opening 13, and a lower surface of each pin 16 is flush with a lower surface of the corresponding conducting portion 22 to increase the strength of the corresponding conducting portion 22. A channel 17 is formed between each two adjacent pins 16. The channels 17 and the pins 16 are alternately arranged on the lower surface of each long edge 11, and each of the channels 17 is in communication with the corresponding recess 14. Since the conducting portion 22 is located in the opening 13, and the electrical connector 600 and the second mating member 500 are heated and soldered in a reflux oven (not shown), such arrangement facilitates circulation of hot air inside and outside the opening 13 and enhances a soldering effect.

FIG. 13 to FIG. 16 show an electrical connector 700 according to a fifth embodiment of the present invention. The electrical connector 700 may be regarded as being formed by sequentially splicing multiple electrical connectors 600 in the fourth embodiment in an extending direction of the short edges 12. A middle of the electrical connector 700 is provided with a mounting platform 18, and the mounting platform 18 is provided with a through hole 180 configured to match with a specific fixing member 900 and fix the electrical connector 700 to the first mating member 400 and the second mating member 500.

Figure 14:
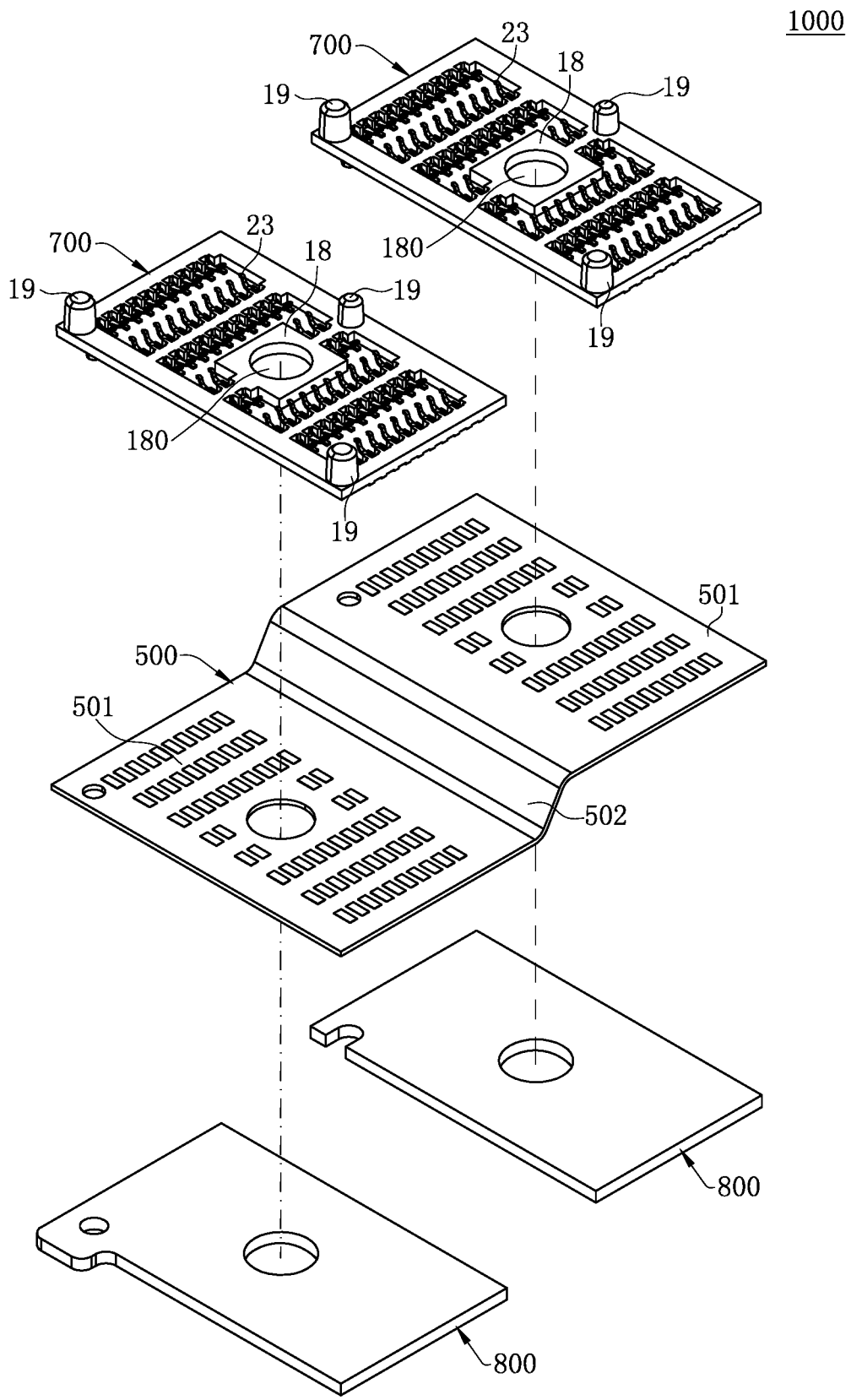
FIG. 14 is an exploded view of a connector assembly including the electrical connector of FIG. 13.
Figure 15:
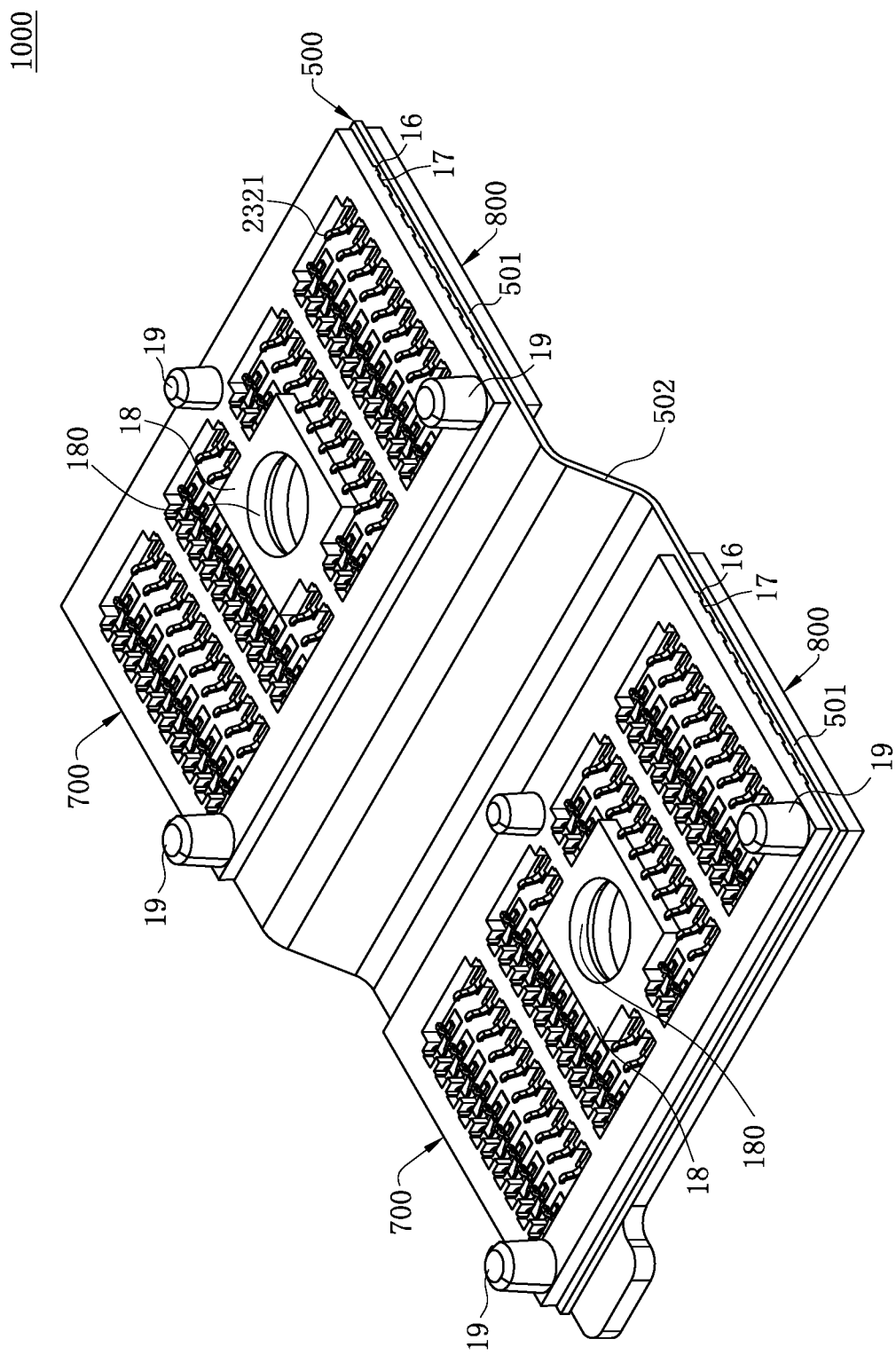
FIG. 15 is an assembled view of FIG. 14.

As shown in FIG. 14 and FIG. 15, in the present embodiment, the two electrical connectors 700 and one of the second mating members 500 are assembled to form a connector assembly 1000. The second mating member 500 is a flexible circuit board and includes two flat supporting areas 501 and a bending area 502 located between the two supporting areas 501. One of the electrical connectors 700 is supported above each of the supporting areas 501, and the bearing area 501 and the electrical connectors 700 are fixed by soldering. The connector assembly 1000 further includes two back plates 800. The back plates 800 are mounted below the supporting areas 501, and the back plates 800 may be made of a hard insulating plastic or a metal plate to protect the supporting areas 501. Due to the existence of the bending area 502, the two electrical connectors 700 may be at different horizontal heights.

Figure 16:
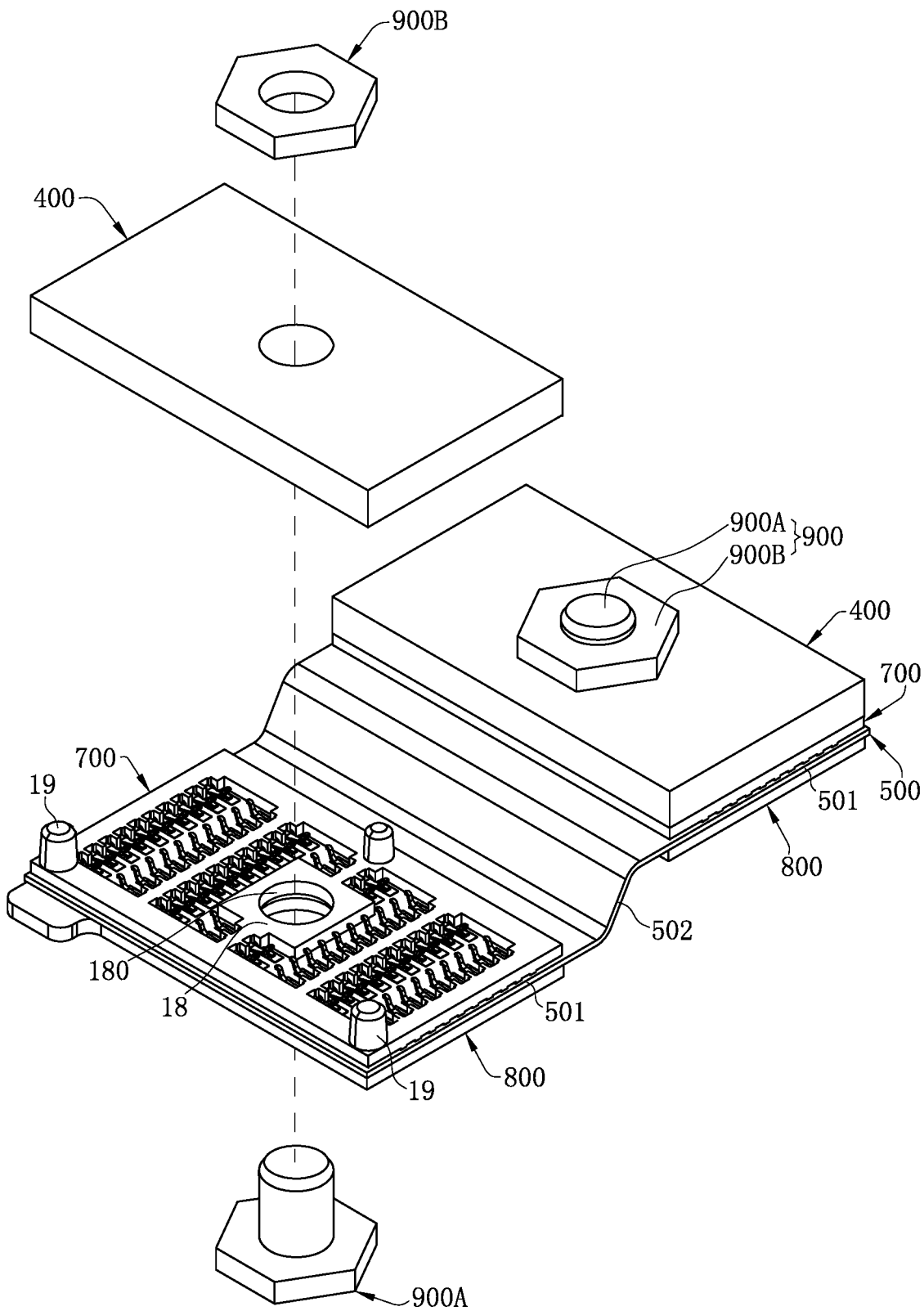
FIG. 16 is a schematic assembled view of the connector assembly with a first mating member and a fixing component.

As shown in FIG. 16, in the present embodiment, the first mating member 400 is a hard printed circuit board or a chip module. The connector assembly 1000 connects the two first mating members 400 at different heights. Each of the electrical connectors 700 mates with one of the first mating members 400. The body 1 of each electrical connector 700 has multiple positioning posts 19 protruding upward to correspond to multiple positioning slots (not shown) on a lower surface of each first mating member 400. In addition, in the present embodiment, the fixing member 900 includes a screw 900A and a nut 900B matched therewith. The screw 900A sequentially passes through the corresponding back plate 800, the corresponding second mating member 500, the mounting platform 18 of the corresponding electrical connector 700 and the corresponding first mating member 400, and is corresponding locked with the screw 900A so as to fix the aforementioned components.

To sum up, the electrical connector according to certain embodiments of the present invention has the following beneficial effects:

1) Each recess 14 is concavely provided and formed on the first side wall 131 of the opening 13, and a portion of the elastic arm 23 is located in the recess 14 and extends toward the opening 13, thereby increasing the length of the elastic arm 23 to increase the elasticity without increasing the overall space occupied by the conductive terminal 2.

2) The virtual median line C of a space between the extending section 232 and the conducting portion 22 is located between the extending section 232 and the third side wall 142. That is, a distance between the third side wall 142 and the extending section 232 is greater than half of a distance between the conducting portion 22 and the extending section 232, such that a terminal connecting portion located between the conducting portion 22 and the extending section 232 is more exposed outside the body 1 and serves as a portion of the elastic arm 23.

3) In a top view, the first virtual central line A of the extending section 232 and the second virtual central line B of the conducting portion 22 are parallel to each other. That is, the extending section 232 and the conducting portion 22 extend in the same direction, and can be staggered from each other when respectively mating with the first mating member 400 and the second mating member 500, thereby preventing the extending section 232 and the conducting portion 22 of the same conductive terminal 2 from moving toward each other in opposite directions and interfering with each other, and also preventing the extending sections 232 and the conducting portions 22 of two adjacent conductive terminals 2 from moving toward each other in opposite directions and interfering with each other.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, located between a first mating member and a second mating member and electrically connecting the first mating member with the second mating member, the electrical connector comprising:
   a body, having an opening running vertically therethrough, wherein the opening has a first side wall, the body further comprises a plurality of recesses concavely formed on the first side wall toward the body, and the body has a partition provided between each two adjacent ones of the recesses; and
   a plurality of conductive terminals arranged along the first side wall, each of the conductive terminals comprising a base fixed to the body, a conducting portion connected to the base and formed by protruding from the first side wall toward the opening, and an elastic arm connected to the base in a corresponding one of the recesses, wherein the conducting portion is configured to be electrically connected to the second mating member, the elastic arm comprises a connecting section located in the corresponding one of the recesses and an extending section connected to the connecting section and formed by protruding from the first side wall toward the opening, the extending section has a contact portion to be electrically connected to the first mating member, and in a top view, a first virtual central line of the extending section and a second virtual central line of the conducting portion are provided to be parallel to and staggered from each other,
   wherein the connecting sections of the conductive terminals one-to-one correspond to the recesses.

2. The electrical connector according to claim 1, wherein each of the recesses comprises a second side wall connected to the first side wall, a third side wall connected to the first side wall and a fourth side wall connected to the second side wall and the third side wall, the second side wall and the third side wall are located at two opposite sides of each of the recesses, the connecting section is located between the second side wall and the third side wall, at least a portion of the base is provided horizontally as a horizontal portion, and the horizontal portion of the base of one of the conductive terminals is fixed in the partition.

3. The electrical connector according to claim 2, wherein the connecting section is formed by protruding from the fourth side wall and extending in a direction toward the first side wall.

4. The electrical connector according to claim 2, wherein a distance between the extending section and the second side wall is greater than a distance between the extending section and the third side wall.

5. The electrical connector according to claim 2, wherein the connecting section is formed by protruding from the third side wall and bending and extending toward the first side wall.

6. The electrical connector according to claim 5, wherein a virtual median line of a space between the extending section and the conducting portion is located between the extending section and the third side wall.

7. The electrical connector according to claim 2, wherein the body has a protruding block formed by protruding from the third side wall toward the second side wall, the protruding block fixes the base, the protruding block has a fifth side wall facing the fourth side wall and provided opposite to the first side wall, and the connecting section is formed by firstly extending from the fifth side wall away from the first side wall and then bending and extending toward the first side wall.

8. The electrical connector according to claim 7, wherein a virtual median line of a space between the extending section and the conducting portion is located between the extending section and the protruding block.

9. The electrical connector according to claim 1, wherein at least a portion of the connecting section bends and extends in a plane where the base is located.

10. The electrical connector according to claim 1, wherein a lower surface of the body has two pins protruding downward and a channel formed between the two pins, the two pins are located at one side of the opening, the pins are configured to abut the second mating member, the channel is in communication with one of the recesses, and the conducting portion protrudes from the first side wall corresponding to one of the pins to be soldered to the second mating member.

11. An electrical connector, located between a first mating member and a second mating member and electrically connecting the first mating member with the second mating member, the electrical connector comprising:
a body, having an opening running vertically therethrough, wherein the opening has a first side wall, and the body further comprises a plurality of recesses concavely formed on the first side wall toward the body, and the body has a partition provided between each two adjacent ones of the recesses; and
a plurality of conductive terminals arranged along the first side wall, each of the conductive terminals comprising a base fixed to the body, a conducting portion connected to the base and an elastic arm connected to the base, wherein at least a portion of the base is provided horizontally as a horizontal portion, at least a portion of the elastic arm is accommodated in a corresponding one of the recesses, the conducting portion is configured to be electrically connected to the second mating member, and the elastic arm is provided with a contact portion to be electrically connected to the first mating member,
wherein the elastic arms of the conductive terminals one-to-one correspond to the recesses.

12. The electrical connector according to claim 11, wherein each of the recesses comprises a second side wall connected to the first side wall, a third side wall connected to the first side wall and a fourth side wall connected to the second side wall and the third side wall, the second side wall and the third side wall are located at two opposite sides of each of the recesses, and the elastic arm is formed by protruding from the fourth side wall and extending in a direction toward the first side wall, and the horizontal portion of the base of one of the conductive terminals is fixed in the partition.

13. The electrical connector according to claim 11, wherein each of the recesses comprises a second side wall connected to the first side wall, a third side wall connected to the first side wall and a fourth side wall connected to the second side wall and the third side wall, the second side wall and the third side wall are located at two opposite sides of each of the recesses, and the elastic arm is formed by protruding from the third side wall and bending and extending toward the first side wall.

14. The electrical connector according to claim 13, wherein the elastic arm comprises an extending section parallel to the conducting portion, and a distance between the extending section and the second side wall is greater than a distance between the extending section and the third side wall.

15. The electrical connector according to claim 11, wherein each of the recesses comprises a second side wall connected to the first side wall, a third side wall connected to the first side wall and a fourth side wall connected to the second side wall and the third side wall, the second side wall and the third side wall are located at two opposite sides of each of the recesses, the body has a protruding block formed by protruding from the third side wall toward the second side wall, the protruding block fixes the base, the protruding block has a fifth side wall facing the fourth side wall and provided opposite to the first side wall, and the elastic arm is formed by firstly extending from the fifth side wall away from the first side wall and then bending and extending toward the first side wall.

16. The electrical connector according to claim 15, wherein the elastic arm comprises an extending section parallel to the conducting portion, and a distance between the extending section and the second side wall is less than a distance between the extending section and the protruding block.

17. The electrical connector according to claim 11, wherein at least a portion of the elastic arm is parallel to the conducting portion.

18. The electrical connector according to claim 11, wherein the base of each of the conductive terminals is completely covered by the body in an arrangement direction of the conductive terminals.

19. The electrical connector according to claim 11, wherein each of the recesses runs through the body vertically, the elastic arm extends from the corresponding one of the recesses toward the opening, and the conducting portion is connected to the base in the opening.

20. The electrical connector according to claim 11, wherein a lower surface of the body has two pins protruding downward and a channel formed between the two pins, the two pins are located at one side of the opening, the pins are configured to abut the second mating member, the channel is in communication with one of the recesses, and the conducting portion protrudes from the first side wall corresponding to one of the pins to be soldered to the second mating member.

* * * * *